(12) United States Patent
Anikitchev et al.

(10) Patent No.: US 7,016,393 B2
(45) Date of Patent: Mar. 21, 2006

(54) APPARATUS FOR PROJECTING A LINE OF LIGHT FROM A DIODE-LASER ARRAY

(75) Inventors: Serguei G. Anikitchev, Belmont, CA (US); R. Russel Austin, Half Moon Bay, CA (US)

(73) Assignee: Coherent, Inc., Santa Clara, CA (US)

( * ) Notice: Subject to any disclaimer, the term of this patent is extended or adjusted under 35 U.S.C. 154(b) by 234 days.

(21) Appl. No.: 10/667,675

(22) Filed: Sep. 22, 2003

(65) Prior Publication Data
US 2005/0063428 A1    Mar. 24, 2005

(51) Int. Cl.
*H01S 5/00* (2006.01)
*H01L 21/27* (2006.01)

(52) U.S. Cl. ...................... 372/101; 359/619
(58) Field of Classification Search ............ 372/101
See application file for complete search history.

(56) References Cited

U.S. PATENT DOCUMENTS

| | | | |
|---|---|---|---|
| 4,497,015 A | 1/1985 | Konno et al. ............... 362/268 |
| 4,619,508 A | 10/1986 | Shibuya et al. ............. 353/122 |
| 4,826,269 A | 5/1989 | Streifer et al. ............. 350/3.72 |
| 5,091,636 A | 2/1992 | Takada et al. .............. 235/454 |
| 5,504,317 A | 4/1996 | Takahashi ................... 235/462 |
| 5,517,359 A | 5/1996 | Gelbart ....................... 359/623 |
| 5,521,748 A | 5/1996 | Sarraf ......................... 359/321 |
| 5,594,526 A | 1/1997 | Mori et al. ................... 355/67 |
| 5,610,763 A | 3/1997 | Kudo .......................... 359/619 |
| 5,710,418 A | 1/1998 | Tawara ....................... 235/472 |
| 5,923,475 A | 7/1999 | Kurtz et al. ................ 359/619 |
| 5,967,645 A | 10/1999 | Anderson ................... 362/259 |
| 5,969,872 A * | 10/1999 | Ben Oren et al. .......... 359/621 |
| 6,014,260 A | 1/2000 | Godard et al. .............. 359/619 |
| 6,356,380 B1 * | 3/2002 | Whitney ..................... 359/321 |
| 6,384,981 B1 | 5/2002 | Hauschild ................... 359/622 |
| 6,411,440 B1 | 6/2002 | Ohuchi et al. .............. 359/621 |
| 6,421,178 B1 | 7/2002 | Lissotschenko et al. .... 359/559 |
| 6,431,727 B1 | 8/2002 | Sugawara et al. .......... 362/244 |

(Continued)

FOREIGN PATENT DOCUMENTS

EP    0 886 162 A2    6/1998

(Continued)

OTHER PUBLICATIONS

*Principles of Optics Electromagnetic Theory of Propagation, Interference and Diffraction of Light*, by Max Born & Emil Wolf, Pergamon Press, 6th Edition, 1980 (reprinted 1984), Chapter "10.5.2 The influence of the condenser on resolution in a microscope," pp. 522-525.

*Primary Examiner*—James Vannucci
(74) *Attorney, Agent, or Firm*—Stallman & Pollock LLP

(57) ABSTRACT

Apparatus for projecting a line of light includes a linear array of diode-lasers arranged in a diode-laser bar. The apparatus includes an optical system. Components of the system include a plurality of lenses and array of cylindrical microlenses having the same spacing as diode-lasers in the diode-laser array. The microlens array is spaced at a distance from the diode-laser bar and aligned with the diode-laser bar such that the front focal plane of the microlens array is between the diode-laser bar and the microlens array. The optical system components are configured and arranged to project overlapping elongated images in a predetermined plane. The overlapping images form the line of light. The elongated images are images of cross-sections of beams from the diode-lasers where the beams are intersected by the front focal plane of the microlens array.

17 Claims, 2 Drawing Sheets

U.S. PATENT DOCUMENTS

| | | | |
|---|---|---|---|
| 6,433,934 B1 * | 8/2002 | Reznichenko et al. | 359/622 |
| 6,478,452 B1 | 11/2002 | Richardson et al. | 632/268 |
| 6,494,371 B1 | 12/2002 | Rekow et al. | 235/454 |
| 6,499,845 B1 | 12/2002 | Sato | 353/38 |
| 6,505,957 B1 | 1/2003 | Chuang | 362/268 |
| 6,773,142 B1 * | 8/2004 | Rekow | 362/259 |
| 2003/0128543 A1 | 7/2003 | Rekow | 362/259 |

FOREIGN PATENT DOCUMENTS

| | | |
|---|---|---|
| EP | 1 331 709 A1 | 7/2003 |
| JP | 2003090959 | 3/2003 |
| JP | 2003218017 | 7/2003 |

* cited by examiner

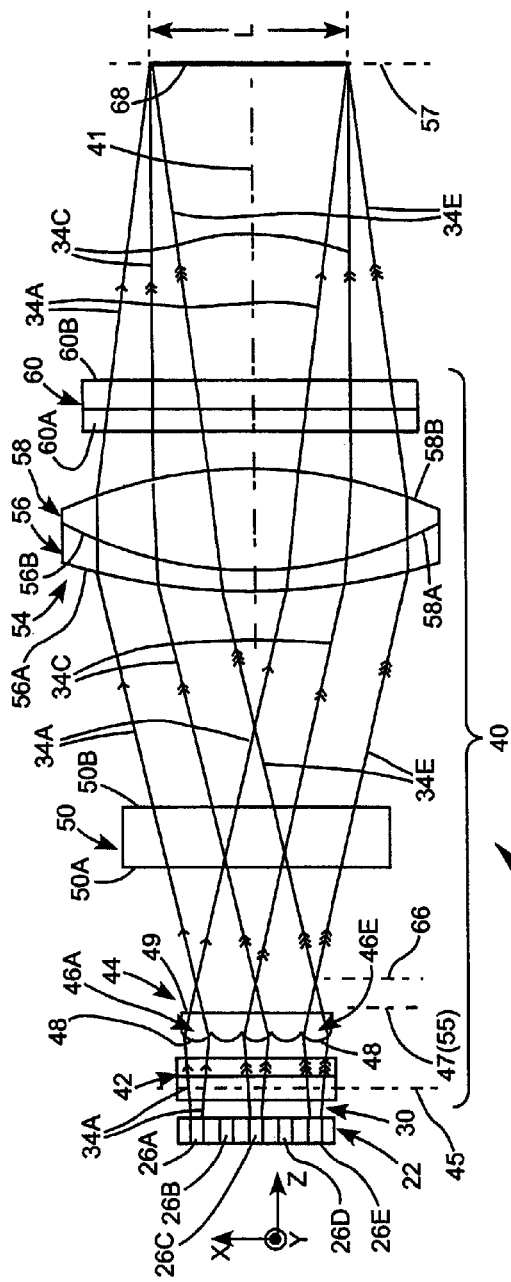
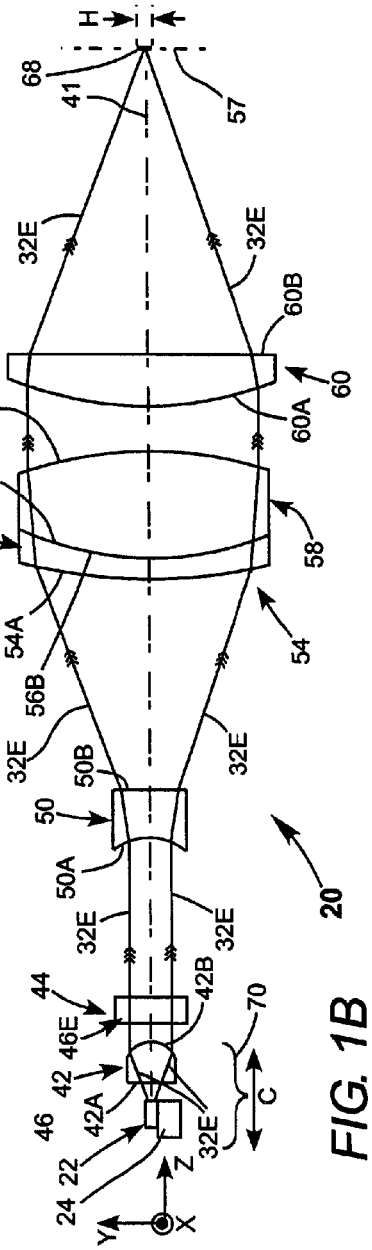

APPARATUS FOR PROJECTING A LINE OF LIGHT FROM A DIODE-LASER ARRAY

TECHNICAL FIELD OF THE INVENTION

The present invention relates in general to diode-laser light-sources. It relates in general to a light source for projecting light from a linear diode-laser array into an elongated line of light.

DISCUSSION OF BACKGROUND ART

Diode-lasers are commonly used as sources of illumination in various graphics applications such as display systems, optical printing systems and optical recording systems. In one type of prior-art imaging system, a linear (one-dimensional) array of light modulators is illuminated by an illuminator including a light source. Illumination from the array of modulators is projected onto a recording medium or the like in the form of a line of images of the modulators. By scanning the recording medium past the line of images and appropriately synchronizing the scanning with operation of the modulator array, the modulator array is used to draw a two-dimensional image on the recording medium.

A preferred light-source for the illuminator is a linear array of diode-lasers commonly referred to as a diode-laser bar. A diode-laser bar can efficiently provide relatively high illumination power, for example 60.0 Watts (W) or more, from a source having a maximum overall dimension no greater than about 10 centimeters (cm). A disadvantage, however, is that each of the diode-lasers in the bar is an individual emitter. This presents problems in selecting an appropriate optical configuration for the illuminator.

This problem is addressed in one prior-art illuminator by including a diode-laser array (or correspondingly an array of light-emitting diodes) having a number of emitters equal to the amount of modulators to be illuminated, and an optical system configured to image each emitter onto a corresponding modulator. This type of illuminator has a disadvantage that it is dependent on all emitters continuing to function. Failure of one emitter could cause at least a reduction in performance of the recording system, for example, a black line on an image in the direction of scanning.

An illuminator apparatus for overcoming this disadvantage is disclosed in U.S. Pat. No. 5,517,359 (Gelbart et al.). Here an optical system is used to project elongated overlapping images of each individual emitter onto a modulator array. The number of emitters need not correspond to the number of modulators, and failure of an individual emitter is described as merely reducing the overall illumination on the modulator rather than effecting the spatial distribution of illumination on the modulator.

Another illuminator apparatus for overcoming this disadvantage is described in a U.S. Pat. No. 6,494,371, assigned to the assignee of the present invention by inventors Rekow et al. The Rekow et al. arrangement comprises a diode-laser bar including a linear array of diode-lasers (emitters). An optical system is arranged with a longitudinal axis thereof parallel to the propagation direction of light from the diode-lasers. The optical system has mutually perpendicular axes designated the fast axis and the slow axis, and corresponding to fast and slow axes of the diode-lasers. The optical system is arranged to focus fast-axis diverging rays of the diode-lasers in a focal plane perpendicular to the longitudinal optical axis, and arranged to form the slow-axis diverging rays of the diode-lasers into a plurality of bundles of parallel rays, one thereof for each diode-laser. The bundles of parallel rays intersect in a focal plane of the optical system. The optical system thereby causes light from the diode-lasers to be formed into a line of light in the focal plane. The line of light has a width in the fast axis of the optical system and a length in the slow axis of the diode-lasers. In certain embodiments of the Rekow et al. apparatus, the distribution of intensity along the line of light is rendered somewhat more uniform by including one or more physical stops arranged to prevent selected portions the fast and slow-axis diverging rays from the diode-laser array from reaching the fast-axis focal plane of the optical system. The selected portions are chosen to optimize the intensity of light distribution along the length of the line of light. While somewhat effective in improving the intensity distribution along the line of light, the distribution is not believed to be optimum and comes at the expense of wasting light from the diode-laser array that is prevented by the physical stops from reaching the focal plane of the optical system.

U.S. patent application 20030128543, by Rekow, also assigned to the assignee of the present invention, discloses an illuminator apparatus that does not require the use of physical stops to achieve uniformity of illumination. An optical system focuses fast axis diverging rays from diode-lasers in a diode-laser array into a fast-axis focal plane of the optical system. The optical system forms slow-axis rays from the diode-lasers into bundles of parallel rays that intersect in the fast-axis focal plane. The focused fast-axis rays and the intersecting bundles of parallel rays form the line of light in the fast-axis focal plane. The optical system includes two arrays of cylindrical microlenses. The microlenses are spaced apart by a distance different from the spacing distance of diode-lasers in the diode-laser bar and are arranged with respect to the diode-laser bar such that each microlens in the array receives light from two or more of the diode-lasers in the diode-laser bar, and a plurality of microlenses receive light from two or more diode-lasers. This provides a line of light having a light uniformity comparable to that disclosed in the '371 Rekow patent, but without the need for physical stops. A potential problem presented by the microlens arrays, however, is that light can be scattered at boundaries or edges of the microlenses. This can provide light loss in the projected line comparable with losses due to stops in the '371 Rekow patent. It has also been found difficult, in manufacturing, to reproducibly align the microlens arrays with diode-laser arrays having a different spacing.

SUMMARY OF THE INVENTION

The present invention is directed to providing line-of-light projecting apparatus that does not have the above-discussed potential shortcomings of the apparatus disclosed in the Rekow patent application. In one aspect, a light projecting apparatus in accordance with the present invention comprises a plurality of diode-lasers each thereof having an emitting-aperture and arranged in an elongated linear array thereof. The diode-lasers are spaced apart by a spacing defined as the distance between the centers of adjacent ones thereof. The linear diode-laser array has a slow axis parallel to the length direction thereof, and a fast axis perpendicular to the slow axis. Light is emitted from each of the diode-lasers, from an emitting aperture thereof, as a beam including diverging rays in both the fast and slow axes, in a general direction of propagation mutually perpendicular to both the fast and slow axes. The apparatus includes an optical system having a plurality of optical components. The optical system has a longitudinal axis parallel to the propagation direction of light from the diode-lasers and has mutually perpendicular fast and slow axes corresponding to the fast and slow axes of the diode-lasers. Components of the optical system include a first lens having positive optical power in the fast axis and zero optical power in the slow axis, and a linear array of cylindrical microlenses, one corresponding to each of the diode-lasers. The microlenses have a slow-axis spacing equal to the spacing of the diode-lasers in the diode-laser array. Each microlens has positive optical power in the slow axis and zero optical power in the fast axis. The microlens array has a front focal plane and a back focal plane. The microlens array is located at a distance from the emitters of the diode-lasers greater than the focal length of lenses in the microlens array but sufficiently close to the emitters that each microlens receives light from only the diode-laser corresponding thereto. The optical components are selected and arranged to project overlapping, elongated images in a predetermined plane. The elongated images are elongated images of cross-sections of the beams from the diode-lasers at a plane corresponding to the front focal plane of the microlens array.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the present invention.

FIGS. 1A and 1B are respectively slow-axis and fast axis views schematically illustrating a preferred embodiment of apparatus in accordance with the present invention, including a linear array of diode-lasers and linear array of cylindrical microlenses.

DETAILED DESCRIPTION OF THE INVENTION

Figure 2:
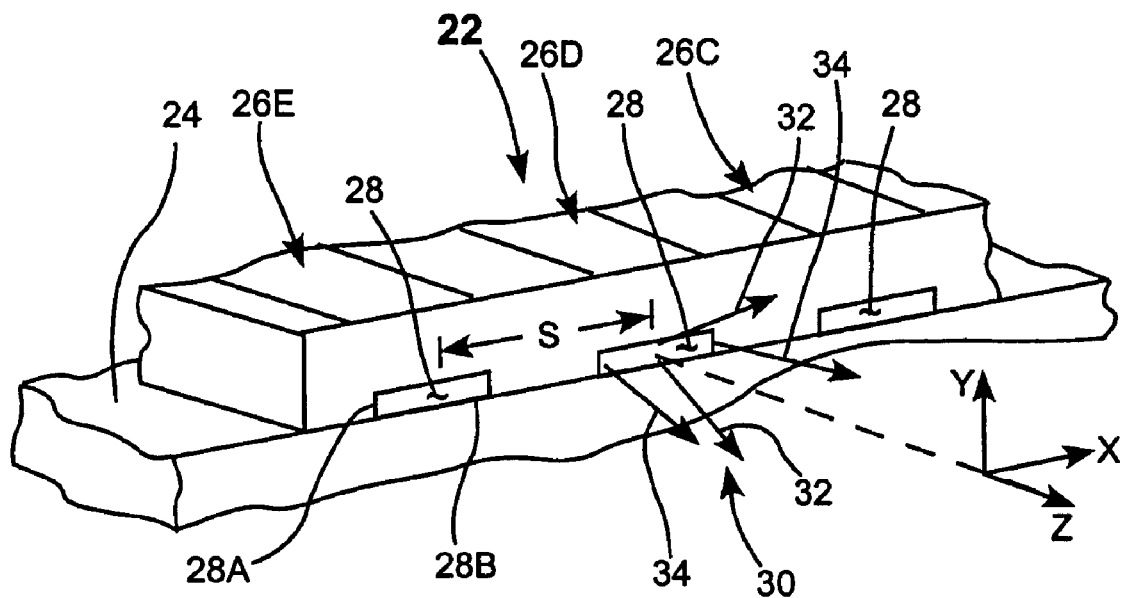
FIG. 2 is a fragmentary three-dimensional view schematically illustrating details of diode-lasers in the diode-laser bar of FIG. 1.

Turning now to the drawings, wherein like features are designated by like reference numerals, FIGS. 1A and 1B schematically depict one preferred embodiment of a line-projector 20 in accordance with the present invention. Line projector 20 includes, as a light-source, a diode-laser bar (liner diode-laser array) 22, details of which are illustrated in FIG. 2. Diode-laser bar 22 is in thermal contact with a heat-sink or sub-mount 24. Diode-laser bar 22 includes a plurality of diode-lasers 26A–E each thereof having an emitting aperture 28. In a multimode diode-laser bar, these emitting apertures have a height 28A of about 1.0 micrometers ($\mu$m) and a width 28B up to about 200.0 $\mu$m. Diode-lasers 26 can be defined as having a pitch or spacing S that is the distance between the centers, or any other corresponding points, of adjacent emitting apertures 28.

The diode-laser bar (and diode-lasers therein) can also be characterized as having a slow axis X parallel to the width direction of emitting apertures 28, and a fast axis Y perpendicular to slow axis X. Light is emitted from an emitting aperture 28 in a general direction (axis) of propagation Z mutually perpendicular to the fast and slow axes. The light is emitted in the form of a diverging beam 30. Rays 32 of beam 30, in fast axis Y, diverge at an half-angle angle between about 20° and 35°. Rays 34 of beam 30 in the slow axis X diverge at a half-angle angle between about 8° degrees and 12° degrees.

Figure 3:
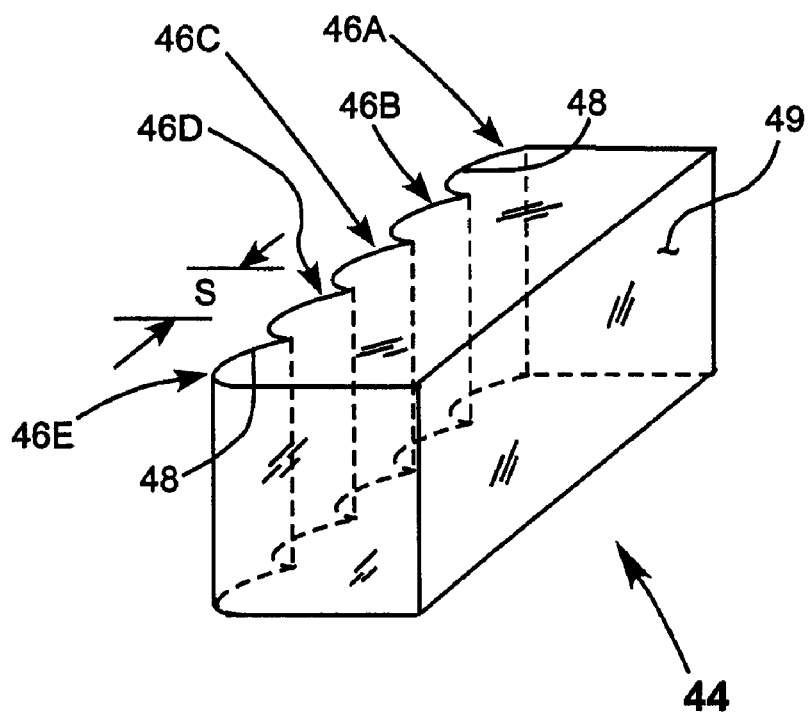
FIG. 3. is a three-dimensional view schematically illustrating details of the cylindrical microlens array of FIG. 1.

Apparatus 20 includes an optical system 40 having a system optical axis (longitudinal axis) 41 and comprising a plurality of optical components. The optical components are described below in order of the location of the components in the propagation direction of light from diode-lasers 26A–E. The components are described with continuing reference to FIG. 1A, FIG. 1B, and FIG. 2, and with reference additionally to FIG. 3.

A cylindrical lens 42 has positive optical power in the fast (Y) axis and zero optical power in the slow axis. This is provided, here, by a plane surface 42A and a cylindrical convex surface 42B. These surfaces are not explicitly designated in FIG. 1A. The spacing of lens 42 from the emitters of the diode-lasers in diode-laser 22 is selected such that fast axis rays from the diode-lasers are collimated after traversing lens 42. This spacing is preferably equal to the front focal length of lens 42.

A linear array 44 of cylindrical microlenses 46A–E has one microlens corresponding to each of the diode-lasers. Only extreme ones 46A and 46E of these microlenses are numerically designated in FIG. 1A for convenience of illustration. The microlenses in the microlens array have an X-axis spacing S equal to the spacing of the diode-lasers in the diode-laser array. Each microlens has a convex cylindrical front surface 48 and a plano rear surface 49. This provides that each of the microlenses has positive optical power in the slow axis and zero optical power in the fast axis. Each surface 48 has the same curvature, and surfaces 48 are aligned in the X-axis. Preferably microlens array 44 is formed as a single unit, as depicted, with a single plane surface 49 being common to all microlenses in the array.

The microlens array has a front focal plane designated by dashed line 45 and a back focal plane designated by dashed line 47. These planes may be alternatively referred to as Fourier planes and correspond, of course, to corresponding planes of the individual microlenses. Microlens array 44 is located at a distance from the emitters of the diode-lasers greater than the focal length of lenses in the microlens array. This provides that front focal plane 45 of the microlens array is located between the diode-laser emitters (not explicitly designated in FIG. 1A) and the microlens array.

The microlens array is positioned sufficiently close to the fast axis lens, and accordingly, sufficiently close to the diode-laser emitters that each microlens receives light only from the diode-laser to which it corresponds. This serves to avoid potential light-scatter problems associated with above-discussed prior-art apparatus including microlens arrays, wherein a microlens receives light from a plurality of diode-lasers.

A cylindrical lens 50 has a concave front surface 50A and a plane rear surface 50B has negative optical power in the fast axis and zero optical power in the slow axis. A cemented doublet lens 54 includes lens elements 56 and 58. Lens element 56 is a negative meniscus element having front and back surfaces 56A and 56B respectively. Lens element 58 is a positive biconvex element having front and back surfaces 58A and 58B respectively. Surface 56B of lens 56 and surface 58A of lens 58 are cemented together to form a common surface. Lens 54 has positive optical power in both the slow axis and the fast axis. Here, lens 54 has equal optical power in each axis. Lens 54 has a front focal plane 55 arranged coincident to back focal plane 47 of microlens array 44 and designated in FIG. 1A by the same dashed line with the reference numeral 55, in parentheses, following reference numeral 45. Lens 54 has a back focal plane designated in FIG. 1A by dashed line 57.

A cylindrical lens 60 has positive optical power in the fast axis and zero optical power in the slow axis. This is provided, here, by a convex front surface 60A and a plane rear surface 60B.

The propagation of slow-axis rays through optical system 40 is next described with particular reference to FIG. 1A. Here slow-axis rays 34A represent extreme ones of the slow-axis rays emitted by diode-laser 26A in diode-laser array 22, i.e., these rays represent the slow-axis extremity of a beam 30 emitted from the diode-laser. The rays are identified in FIG. 1A by a single arrowhead.

Rays 34A are transmitted through cylindrical lens 42 and emerge therefrom with divergence unchanged (except for bow-tie aberration). These diverging rays (and all other rays therebetween) are incident on microlens 46A. The diverging rays 34A are caused to converge by the microlens and intersect near an intermediate pupil of optical system 40, indicated in FIG. 1 by dashed line 66. After intersecting in the pupil, rays 34A again diverge, then pass through cylindrical lens 50 and emerge therefrom with divergence unchanged. The diverging rays 34A pass through lens 54 and emerge therefrom parallel to each other. The parallel rays 34A pass through cylindrical lens 60 and emerge therefrom still parallel to each other. This treatment of diverging rays by optical system 40 is similar for all diode-lasers in diode-laser array 22 as indicated by rays 34C from diode-laser 26C (identified by double arrowheads) and rays 34E from diode-laser 26E (identified by triple arrowheads). The extreme slow-axis diverging rays from each diode-laser in diode-laser array 22 emerge from lens 54 as parallel pairs of rays that intersect in a back focal plane 57 of lens 54.

The propagation of fast-axis rays through optical system 40 is next described with particular reference to FIG. 1B. Here, slow-axis rays 32E represent extreme ones of the fast-axis rays emitted by diode-laser 26E in diode-laser array 22, ie., these rays represent the fast-axis extremity of a beam 30 emitted from the diode-laser. The rays are identified in FIG. 1B by triple arrowheads.

Rays 32E, strongly diverging on leaving diode-laser array 22, are collimated by cylindrical lens 52 and are still collimated after traversing lens 46E of microlens array 44. The collimated rays are caused to diverge after traversing cylindrical lens 50. Lenses 54 and 60 then cause rays 32E to converge such that the rays intersect (are focused in the fast axis) at focal plane 57 of lens 30. It will be evident to one skilled in the art without further detailed description, that fast axis rays from all other diode-lasers in diode-laser array are also fast-axis focused in focal plane 57.

The above-discussed treatment of fast and slow axis rays by optical system 40 forms superimposed (overlapped) elongated images (68) in back focal plane 57 of lens 54. The images have a height H and a width (or length) L. The alignment (coincidence) of front focal plane 55 of lens 54 with back focal plane 47 of microlens array 44 provides that these images are highly elongated images of a cross-section of each diode-laser beam 30 in the front focal plane 45 of microlens array 44. Were focal plane 55 aligned with pupil plane 66 of the optical system, the images would be (re-layed) elongated images of the actual diode-laser emitters 28 (see FIG. 2). Imaging the beam cross-section is chosen in the present invention, as the light distribution across a beam 30 at a location remote from a diode-laser emitter is significantly more uniform than at the emitter itself.

As the fast axis divergence of a beam 30 is greater than the slow axis divergence, the aspect ratio (X-axis dimension divided by Y-axis dimension) of a beam 30 will be less than the ratio of an emitter width 28B divided by an emitter height 28A. Absent any measure to deal with this, images formed in focal plane 57 would have an aspect ratio which may be less than the aspect ratio of an emitter and less than has been achieved in prior-art laser line projectors.

This is remedied in the apparatus of the present invention by inclusion of negative cylindrical lens 50 working in combination with lens 54 and positive cylindrical lens 60. This combination provides that optical system 40 behaves as a telephoto lens in the fast axis only, allowing the system to have a fast axis magnification and a slow axis magnification sufficiently different to cause the height H of images 68 in plane 57 to be reduced without reducing length L. This provides that the elongated image of the beam cross-section can have an aspect ratio (H/L) up to 800 or greater. By way of comparison, the aspect ratio of an emitter is typically no greater than about 200, while the aspect ratio of a beam cross-section in focal plane 45 may be as low as unity.

Apparatus in accordance with the present invention has certain practical aspects that facilitate alignment and adjustment of the apparatus during assembly in manufacturing. One such advantage is that X and Y-axis alignment of the microlens array with diode-laser array 22 can be conveniently optimized by evaluating the quality of individual beams at pupil plane 66. This is because, as discussed above, each microlens 46 in microlens array 44 receives light only from the diode-laser to which it corresponds.

Another advantage is that there is some flexibility of the Z-axis spacing of diode-laser array 22 and cylindrical lens 42 as a group (i.e., with spacing between diode-laser 22 and lens 42 fixed) with microlens array 44 and the remaining components of optical system 40. This is because it is the beam cross-sections in front focal plane 45 of microlens array 44 that are being imaged and not diode-laser emitters 28. Maintaining a fixed Z-axis spacing between diode-laser array 22 and cylindrical lens 42 provides that collimation of fast-axis rays 32 by lens 42 is maintained and the focus of the fast-axis rays in back focal plane 57 of essentially unchanged, the term "essentially" here, meaning within the range of optical correction in the fast-axis of optical system 40. This spacing flexibility is valuable because light uniformity can vary somewhat from one diode-laser bar to another and between individual diode-lasers in any batch of diode-laser bars that are nominally the same. Once initial alignment of apparatus 20 is complete, the Z-axis spacing of diode-laser array 22 and cylindrical lens 42 as a group with respect to microlens array 44 can be varied (as indicated in FIG. 1B by bracket 70 and double arrow C), while measuring slow-axis light uniformity in plane 57, until the light uniformity is optimized. The extent of motion possible for group 70 is limited by factors including the requirement that each microlens receive light only from the diode-laser with which it is associated, and specified upper and lower limits for length L and height H of a projected image 68.

In one computed example of apparatus 20 optical components thereof are specified as follows. Lens 42 is formed from glass S-TIH53, has a vertex thickness of 1.5 millimeters (mm) and surface 42B of the lens has a radius of curvature (radius) of 0.75 mm (with aspherical terms). Microlens array 44 is formed from S-TIH53. Each lens 46 in the array has vertex thickness of about 0.55 mm and surface 48 of the lens has a radius of 0.8 mm, conic constant −0.8. Lens 50 is formed from BK7, has a vertex thickness of 2.4 mm and surface 50A of the lens has a radius of 15 mm.

Lens element 56 is formed from SF5, has a vertex thickness of 3.5 mm and surfaces 56A and 56B of the lens element have radii of 196.9 and 61.9 mm and (Q) respectively. Lens element 58 is formed from SK11, has a vertex thickness of 9 mm and surfaces 58A and 58B of the lens element have radii of 61.9 and (Q) −117.7 mm respectively. Lens 60 is formed from SF10, has a vertex thickness of 6.35 mm and surface 60A of the lens has a radius of 103.4 mm.

Spacing between emitters 28 of diode-laser array 22 and lens 42 is 0.5 mm. Spacings between lenses 42, 44, 50, 54 and 60 are 0.3 mm, 27.3 mm, 113 mm, and 11.0 mm respectively. Plane 57 is located 140 mm from surface 60B of lens 60. The wavelength of radiation emitted by the diode-lasers is assumed to be 810 nm.

Diode-laser 22 includes twenty diode-lasers 26 having a spacing S of 0.5 mm with each emitter 28 having a height of 1 $\mu$m and a width of 160 $\mu$m. Images 68 have a height H of approximately 35.0 $\mu$m and length L of 20.0 mm. Computed uniformity of the light along an image 68 is better than 85%.

Those skilled in the art will recognize that various changes above-described apparatus 20 are possible without departing from the spirit and scope of the present invention. These include but are not limited to: changing the number of diode-lasers in array 22 (with corresponding change in the number of microlenses 46); providing more than one lens element in one or more of lenses 42, 50, and 60, and microlens array 44 with elements either cemented or air-spaced; providing less or than two elements in lens 54 with elements either cemented or air-spaced; and providing an aspheric surface on any curved surface of any lens or lens element. Microlenses can have any shape selected from convex-plano, convex-convex, plano-convex, and convex-concave.

The present invention is described above in terms of a preferred embodiment. The invention, however, is not limited to the embodiment described and depicted. Rather, the invention is limited only by the claims appended hereto.

What is claimed is:

1. An illumination apparatus for projecting a line of light, comprising;
    a plurality of diode-lasers each thereof having an emitting-aperture and arranged in an elongated linear array thereof, said diode-lasers being spaced apart by a spacing defined as the distance between the centers of adjacent ones thereof;
    said linear diode-laser array having a slow axis parallel to the length direction thereof, and a fast axis perpendicular to said slow axis, light being emitted from each of said diode-lasers, from an emitting aperture thereof, as a beam including diverging rays in both said fast and slow axes, in a general direction of propagation mutually perpendicular to both said fast and slow axes;
    an optical system, said optical system having a longitudinal axis parallel to the propagation direction of light from said diode-lasers and having mutually perpendicular fast and slow axes corresponding to said fast and slow axes of said diode-lasers;
    said optical system having a plurality of components including a first lens having positive optical power in said fast axis and zero optical power in said slow axis, a linear array of cylindrical microlenses, one corresponding to each of said diode-lasers, said microlenses having a slow-axis spacing equal to the spacing of said diode-lasers in said diode-laser array, each microlens having positive optical power in said slow axis and zero optical power in said fast axis, and said microlens array having a front focal plane and a back focal plane;
    said microlens array being located at a distance from said emitters of said diode-lasers greater than the focal length of lenses in said microlens array but sufficiently closes to said emitters of said diode-lasers that each microlens receives light from only a said diode-laser corresponding thereto, wherein said optical system components further include a second lens having negative optical power in said fast axis and zero optical power in said slow axis, a third lens having positive optical power in both said slow axis and said fast axis, said third lens having a front focal plane and a back focal plane, and a fourth lens having positive optical power in said fast axis and zero optical power in said slow axis, said optical components being listed in order of location along the direction of propagation of light from the diode-lasers; and
    wherein said optical system components are selected and arranged to form overlapping elongated images in a predetermined plane, said images being elongated images of cross-sections of said beams from said diode-lasers at a plane corresponding to said front focal plane of said microlens array.

2. The apparatus of claim 1, wherein said components of said optical system are arranged to focus said fast axis rays in said back focal plane of said positive lens, said front focal plane of said third lens is aligned with said back focal plane of said microlens array and said predetermined plane of said images is said back focal plane of said third lens.

3. An illumination apparatus for projecting a line of light, comprising;
    a plurality of diode-lasers each thereof having an emitting-aperture and arranged in an elongated linear array thereof, said diode-lasers being spaced apart by a spacing defined as the distance between the centers of adjacent ones thereof;
    said linear diode-laser array having a slow axis parallel to the length direction thereof, and a fast axis perpendicular to said slow axis, light being emitted from each of said diode-lasers, from an emitting aperture thereof, as a beam including diverging rays in both said fast and slow axes, in a general direction of propagation mutually perpendicular to both said fast and slow axes;
    an optical system, said optical system having a longitudinal axis parallel to the propagation direction of light from said diode-lasers and having mutually perpendicular fast and slow axes corresponding to said fast and slow axes of said diode-;
    said optical system having components including a first lens having positive optical power in said fast axis and zero optical power in said slow axis, a linear array of cylindrical microlenses, one corresponding to each of said diode-lasers, said microlenses having a slow-axis spacing equal to the spacing of said diode-lasers in said diode-laser array, each microlens having positive optical power in said slow axis and zero optical power in said fast axis, and said microlens array having a front focal plane and a back focal plane;
    said optical system components further including a second lens having negative optical power in said fast axis and zero optical power in said slow axis, a third lens having positive optical power in both said slow axis and said fast axis, said third lens having a front focal plane and a back focal plane, and a fourth lens having positive optical power in said fast axis and zero optical power in said slow axis, said optical components being listed in order of location along the direction of propagation of light from the diode-lasers;

said microlens array being located at a distance from said emitters of said diode-lasers greater than the focal length of lenses in said microlens array but sufficiently closes to said emitters of said diode-lasers that each microlens receives light from only a said diode-laser corresponding thereto;

said optical components of said optical system arranged to focus said fast axis rays in said back focal plane of said positive lens; and said front focal plane of said third lens being aligned with said back focal plane of said microlens array, whereby said optical components form overlapping elongated images in said back focal plane of said third lens, said images being elongated images of cross-sections of said beams from said diode-lasers at a plane corresponding to said front focal plane of said microlens array.

4. The apparatus of claim 3, wherein said first lens has a convex front surface and a plane back surface, said second lens has a concave front surface and a plane back surface, said third lens has equal optical power in said slow axis and said fast axis and said fourth lens having a convex front surface and a plane rear surface.

5. The apparatus of claim 4, wherein any one of said concave and convex surfaces has an aspheric curvature.

6. The apparatus of claim 3 wherein any one of said first, second, third, and fourth lenses includes more than one lens element.

7. The apparatus of claim 6, wherein said third lens is a cemented doublet lens including first and second lens elements.

8. The apparatus of claim 7, wherein any surface of said third lens has an aspheric curvature.

9. The apparatus of claim 3, wherein said first lens is arranged to collimate fast axis rays received from said diode-lasers.

10. The apparatus of claim 3, wherein each of the microlenses in the microlens array has the same slow-axis optical power.

11. A method for projecting a line of light, comprising;
(a) providing an illumination apparatus including a plurality of diode-lasers each thereof having an emitting-aperture and arranged in an elongated linear array thereof, said diode-lasers being spaced apart by a spacing defined as the distance between the centers of adjacent ones thereof said linear diode-laser array having a slow axis parallel to the length direction thereof, and a fast axis perpendicular to said slow axis, light being emitted from each of said diode-lasers, from an emitting aperture thereof, as a beam including diverging rays in both said fast and slow axes, in a general direction of propagation mutually perpendicular to both said fast and slow axes;
(b) providing an optical system, said optical system having a longitudinal axis parallel to the propagation direction of light from said diode-lasers and having mutually perpendicular fast and slow axes corresponding to said fast and slow axes of said diode-lasers, said optical system having components including a first lens having positive optical power in said fast axis and zero optical power in said slow axis, a linear array of cylindrical microlenses, one corresponding to each of said diode-lasers, said microlenses having a slow-axis spacing equal to the spacing of said diode-lasers in said diode-laser array, each microlens having positive optical power in said slow axis and zero optical power in said fast axis, and said microlens array having a front focal plane and a back focal plane, said optical system components further including a second lens having negative optical power in said fast axis and zero optical power in said slow axis, a third lens having positive optical power in both said slow axis and said fast axis, said third lens having a front focal plane and a back focal plane, and a fourth lens having positive optical power in said fast axis and zero optical power in said slow axis, said optical components being listed in order of location along the direction of propagation of light from the diode-lasers, said microlens array being located at a distance from said emitters of said diode-lasers greater than the focal length of lenses in said microlens array but sufficiently closes to said emitters of said diode-lasers that each microlens receives light from only a said diode-laser corresponding thereto;
(c) spacing said first lens at distance from said emitting apertures of said diode-lasers such that said fast-axis rays are collimated thereby;
(d) arranging said optical components of said optical system to focus said fast axis rays in said back focal plane of said third lens;
(e) aligning said front focal plane of said third lens with said back focal plane of said microlens array, whereby said optical components form overlapping elongated images in said back focal plane of said third lens, said images providing the line of light and being elongated images of cross-sections of said beams from said diode-lasers at a plane in said beams corresponding to said front focal plane of said microlens array; and
(f) while maintaining the spacing between said first lens and said emitting apertures of said diode-lasers, varying the spacing between said first lens and said microlens array to optimize uniformity of illumination in the projected line of light.

12. A method for projecting a line of light from a diode-laser array, said array including a plurality of diode-lasers each thereof having an emitting-aperture wherein light is emitted along a slow axis parallel to the length direction of the array and a fast axis perpendicular to said slow axis comprising the steps of:
(a) locating a microlens at a distance from said emitting apertures of the diode-lasers greater than the focal length of lenses in said microlens array but sufficiently close to the emitting apertures of the diode-lasers that each microlens receives light from only one of a said diode-lasers;
(b) collimating the light emitted along the fast axis with a cylindrical lens;
(c) focusing the light emitted along the slow axis with said microlens array;
(d) following step (b) diverging the light in the fast axis with a cylindrical lens;
(e) following steps (c) and (d) collimating the light in the slow axis and focusing the light in the fast axis with a lens assembly in order to project a line of light having a length in the slow axis and a height in the fast axis and wherein steps (b), (c), (d), and (e) are performed on the light emitted from each diode-laser in the diode-laser.

13. An illumination apparatus for projecting a line of light, comprising;
a plurality of diode-lasers each thereof having an emitting-aperture and arranged in an elongated linear array thereof, said diode-lasers being spaced apart by a spacing defined as the distance between the centers of adjacent ones thereof;

said linear diode-laser array having a slow axis parallel to the length direction thereof, and a fast axis perpendicular to said slow axis, light being emitted from each of said diode-lasers, from an emitting aperture thereof, as a beam including diverging rays in both said fast and slow-axes, in a general direction of propagation mutually perpendicular to both said fast an slow-axes;

an optical system, said optical system having a longitudinal axis parallel to the propagation direction of light from said diode-lasers and having mutually perpendicular fast and slow axes corresponding to said fast and slow axes of said diode-lasers and said optical system including a plurality of optical components;

said optical system components including a first lens having positive optical power in said fast axis and zero optical power in said slow axis, and a linear array of cylindrical microlenses, one corresponding to each of said diode-lasers, said microlenses having a slow-axis spacing equal to the spacing of said diode-lasers in said diode-laser array, each microlens having positive optical power in said slow axis and zero optical power in said fast axis;

said optical system components further including a second lens having negative optical power in said fast axis and zero optical power in said slow axis, a third lens having positive optical power in both said slow axis and said fast axis, and a fourth lens having positive optical power in said fast axis and zero optical power in said slow axis, said optical components being listed in order of location along the direction of propagation of light from the diode-lasers;

said microlens array being located at a distance from said emitters of said diode-lasers greater than the focal length of lenses in said microlens array but sufficiently closes to said emitters of said diode-lasers that each microlens receives light from only a said diode-laser corresponding thereto; and wherein said optical system is arranged to project said fast-axis and slow-axis rays in a common plane to form the line of light.

14. The apparatus of claim 13, wherein said first lens has a convex front surface and a plane back surface, said second lens has a concave front surface and a plane back surface, said third lens has equal optical power in said slow axis and said fast axis and said fourth lens having a convex front surface and a plane rear surface.

15. The apparatus of claim 14, wherein any one of said concave and convex surfaces has an aspheric curvature.

16. The apparatus of claim 13, wherein any one of said first, second, third, and fourth lenses includes more than one lens element.

17. The apparatus of claim 16, wherein said third lens is a cemented doublet lens including first and second lens elements.

* * * * *